(12) United States Patent
Huo et al.

(10) Patent No.: US 7,338,862 B2
(45) Date of Patent: Mar. 4, 2008

(54) METHODS OF FABRICATING A SINGLE TRANSISTOR FLOATING BODY DRAM CELL HAVING RECESS CHANNEL TRANSISTOR STRUCTURE

(75) Inventors: Zong-Liang Huo, Suwon-si (KR); Seung-Jae Baik, Seoul (KR); In-Seok Yeo, Seoul (KR); Hong-Sik Yoon, Seongnam-si (KR); Shi-Eun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 11/335,333

(22) Filed: Jan. 19, 2006

(65) Prior Publication Data

US 2006/0220085 A1 Oct. 5, 2006

(30) Foreign Application Priority Data

Mar. 31, 2005 (KR) .................. 10-2005-0027239

(51) Int. Cl.
*H01L 21/336* (2006.01)
(52) U.S. Cl. ................ 438/259; 438/272; 257/E21.428
(58) Field of Classification Search ................ 438/259, 438/270, 272; 257/E21.428
See application file for complete search history.

(56) References Cited

U.S. PATENT DOCUMENTS

| | | | | |
|---|---|---|---|---|
| 5,142,640 | A * | 8/1992 | Iwamatsu | 257/332 |
| 6,245,638 | B1 * | 6/2001 | Gardner et al. | 438/424 |
| 6,358,800 | B1 * | 3/2002 | Tseng | 438/268 |
| 6,436,729 | B1 * | 8/2002 | Abe | 438/60 |
| 6,656,807 | B2 | 12/2003 | Bronner et al. | 438/296 |
| 6,661,042 | B2 | 12/2003 | Hsu | 257/239 |
| 6,780,732 | B2 | 8/2004 | Durcan et al. | 438/430 |
| 6,919,647 | B2 * | 7/2005 | Hackler et al. | 257/250 |
| 2005/0090068 | A1 * | 4/2005 | Park | 438/305 |

FOREIGN PATENT DOCUMENTS

| | | |
|---|---|---|
| JP | 02-114673 | 4/1990 |
| JP | 08-097419 | 4/1996 |
| JP | 2003-031693 | 1/2003 |
| KR | 1020040077289 | 9/2004 |

OTHER PUBLICATIONS

Office Action for Korean Patent Application No. 10-2005-0027239 mailed on May 16, 2006.
Figure 7.20: Cross section of a 0.6 μm SOI BiCMOS technology and Figure 7.21: Cross Section of a Vertical SOI Bipolar Transistor (source unknown) (1998).
English Translation of Office Action for Korean Patent Application No. 10-2005-0027239 mailed on May 16, 2006.

* cited by examiner

*Primary Examiner*—T. N. Quach
(74) *Attorney, Agent, or Firm*—Myers Bigel Sibley & Sajovec

(57) ABSTRACT

Methods of fabricating a single transistor floating body dynamic random access memory (DRAM) cell include forming a barrier layer on a semiconductor substrate. A body layer is formed on the barrier layer. An isolation layer is formed defining a floating body region within the body layer. A recess region is formed in the floating body region. A gate electrode is formed in the recess region. Impurity ions of a first conductivity type are implanted into a portion of the floating body region on a first side of the recess region to define a source region and into a portion of the floating body on an opposite side of the recess region to define a drain region to provide a floating body.

14 Claims, 5 Drawing Sheets

METHODS OF FABRICATING A SINGLE TRANSISTOR FLOATING BODY DRAM CELL HAVING RECESS CHANNEL TRANSISTOR STRUCTURE

CROSS-REFERENCE TO RELATED APPLICATION

This application is related to and claims priority from Korean Patent Application No. 2005-0027239, filed Mar. 31, 2005, the contents of which are hereby incorporated herein by reference in their entirety.

BACKGROUND OF THE INVENTION

The present invention relates to semiconductor devices and methods of fabricating the same, and more particularly, to single transistor floating body dynamic random access memory (DRAM) cells having a recess channel transistor structure and methods of fabricating the same.

A dynamic random access memory (DRAM) is one kind of volatile memory device. A DRAM has a plurality of DRAM cells storing digital data, i.e., "0"s and "1"s. A structure using one capacitor, one transistor, and interconnections to implement the DRAM cell is widely employed. However, as electronic products using semiconductor devices are being made increasingly thin, light-weight, and compact, it has generally become necessary to highly integrate DRAMs. That is, as many DRAM cells as possible are formed within a limited area. However, techniques for highly integrating the DRAMs are faced with several limits.

For example, the capacitor generally has a top electrode, a bottom electrode, and a capacitor dielectric layer. The top and bottom electrodes have a mutually overlapping region in which the capacitor dielectric layer is formed. The capacitance of the capacitor is typically directly proportional to the size of the overlapping region and inversely proportional to the thickness of the capacitor dielectric layer. Reducing the size of the capacitor as much as possible is conducive to achieving high integration of the DRAM. However, reduction of the size of the capacitor generally causes a decrease in capacitance. Reducing the thickness of the capacitor dielectric layer to increase the capacitance may result in leakage current. In addition, the overlapping region may be extended to increase capacitance, but this technique generally increases the difficulty of certain processes, such as a process for increasing an aspect ratio.

To overcome such limitations, a single transistor floating body DRAM cell has been researched. The single transistor floating body DRAM cell generally has a single transistor having a floating body region and omits the capacitor. Thus, the single transistor floating body DRAM cell has a structural advantage over the DRAM cell in terms of high integration as it need not include a cell capacitor.

FIG. 1 is a cross-sectional view of a conventional single transistor floating body DRAM cell. As shown in FIG. 1, the conventional single transistor floating body DRAM cell has a buried oxide layer (BOX) 12 formed on a semiconductor substrate 10. A floating body 13, a source region 16, and a drain region 17 are formed on the BOX 12. A gate dielectric layer 14 and a gate electrode 15 are sequentially stacked on the floating body 13. The source region 16 is connected to a ground GND, the drain region 17 is connected to a bit line BL and the gate electrode 15 is connected to a word line WL.

As shown in FIG. 1, the floating body 13 is electrically isolated by the BOX 12, the gate dielectric layer 14, the source region 16, and the drain region 17. The single transistor floating body DRAM cell stores and reads data using a floating body effect.

An operation of writing (storing) data to the single transistor floating body DRAM cell will now be described. The source region 16 is grounded, a word line program voltage greater than a threshold voltage is applied to the gate electrode 15 and a bit line program voltage is applied to the drain region 17. The write operation generates holes in the floating body 13 near the drain region 17, which are accumulated within the floating body 13 and change the threshold voltage.

An operation of reading data from the single transistor floating body DRAM cell will now be described. The source region 16 is grounded, a word line read voltage lower than the word line program voltage is applied to the gate electrode 15 and a bit line read voltage is applied to the drain region 17. In this case, an amount of current flowing between the source region 16 and the drain region 17 changes in response to whether the holes are present. That is, the amount of current flowing between the source region 16 and the drain region 17 is sensed to read data stored in the single transistor floating body DRAM cell.

In addition, the threshold voltage changes according to the number of accumulated holes. That is, the current flowing between the source region 16 and the drain region 17 changes in response to the number of accumulated holes.

However, the gate electrode 15 generally must be reduced in size in order to highly integrate the conventional single transistor floating body DRAM cell. Reduction of the size of the gate electrode 15 is accompanied by reduction of a channel length formed within the floating body 13. The reduction of the channel length typically causes a short channel effect, which may include drain-induced barrier lowering (DIBL) and sub-threshold swing.

Reduction of the channel length causes a barrier between the source region 16 and the drain region 17 to be reduced. That is, the threshold voltage changes in response to a voltage difference between the source region 16 and the drain region 17. This phenomenon is referred to as DIBL. The DIBL typically makes it difficult to control a drain current by means of the threshold voltage.

In addition, an inversion layer may be formed within the floating body 13 in the case of a voltage lower than the threshold voltage, i.e., a sub-threshold voltage. Accordingly, a small amount of current may flow between the source region 16 and the drain region 17 even when the sub-threshold voltage is applied to the gate electrode 15. That is, a sub-threshold swing may occur. As a result, the reduction of the channel length may make it difficult to turn off the transistor.

The DIBL and the sub-threshold swing may degrade a sensing margin of the single transistor floating body DRAM cell. That is, the short channel effect may make it difficult to store and read data in the single transistor floating body DRAM cell.

A single transistor floating body DRAM cell is described in Japanese Patent Laid-Open Publication No. 2003-31693 entitled "Semiconductor Memory Device" to Osawa Takashi. Another single transistor floating body DRAM cell is described in U.S. Pat. No. 6,661,042 entitled "One-transistor Floating Body DRAM Cell in Bulk CMOS Process with Electrically Isolated Charge Storage Region" to Hsu.

SUMMARY OF THE INVENTION

Embodiments of the present invention provide single transistor floating body dynamic random access memory (DRAM) cells including a semiconductor substrate and a barrier layer on the semiconductor substrate and a recess channel transistor on the barrier layer. The recess channel transistor includes a source region of a first conductivity type, a drain region of the first conductivity type spaced apart from the source region and a floating body of a second conductivity type between the barrier layer and the source region and the drain region. The floating body includes a recess region between the source region and the drain region. A gate electrode is in the recess region.

In some embodiments, the single transistor floating body DRAM cell further includes an isolation layer on the semiconductor substrate and contacting the barrier layer and the floating body. The isolation layer has a bottom surface positioned at a level relative to the semiconductor substrate no higher than a top surface of the barrier layer and a top surface positioned at a level higher than a top surface of the floating body. The recess region may have a bottom surface positioned at a level relative to the semiconductor substrate lower than bottom surfaces of the source region and the drain region.

In further embodiments, the recess channel transistor further includes a gate dielectric layer between the gate electrode and the floating body. The gate electrode may have a bottom surface positioned at a level lower than the bottom surfaces of the source region and the drain region. The first conductivity type may be an N-type and the second conductivity type may be a P-type or the first conductivity type may be a P-type and the second conductivity type may be an N-type. The barrier layer may be a high concentration impurity region of the first conductivity type and/or an oxide layer.

In other embodiments, single transistor floating body dynamic random access memory (DRAM) cells include an integrated circuit substrate, a barrier layer on the substrate and a recess channel transistor on the barrier layer. The recess channel transistor includes an N-type source region, an N-type drain region spaced apart from the source region and a P-type floating body between the barrier layer and the source region and the drain region. The floating body includes a recess region extending across the floating body between the source region and the drain region. A gate electrode is in the recess region.

In further embodiments, the single transistor floating body DRAM cell may further include a gate dielectric layer between the gate electrode and the floating body and an isolation layer on the substrate. The isolation layer contacts the barrier layer and the floating body. The isolation layer has a bottom surface positioned at a level relative to the substrate no higher than a top surface of the barrier layer and a top surface positioned at a level higher than a top surface of the floating body. The gate electrode may fill the recess region. The recess region may have a bottom surface positioned at a level relative to the substrate lower than bottom surfaces of the source region and the drain region. The gate electrode may have a bottom surface positioned at a level lower than the bottom surfaces of the source region and the drain region.

In yet other embodiments, methods of fabricating a single transistor floating body dynamic random access memory (DRAM) cell include forming a barrier layer on a semiconductor substrate. A body layer is formed on the barrier layer. An isolation layer is formed defining a floating body region within the body layer. A recess region is formed in the floating body region. A gate electrode is formed in the recess region. Impurity ions of a first conductivity type are implanted into a portion of the floating body region on a first side of the recess region to define a source region and into a portion of the floating body on an opposite side of the recess region to define a drain region to provide a floating body.

In further embodiments, bottom surfaces of the source and drain regions are at a level higher relative to the substrate than a bottom surface of the gate electrode and the gate electrode is an insulated gate electrode. Forming the barrier layer includes forming the barrier layer by implanting impurity ions of the first conductivity type into the semiconductor substrate. Forming the barrier layer may include forming an oxide layer. Forming the isolation layer may include forming the isolation layer in contact with the barrier layer and the floating body region and having a bottom surface positioned at a level relative to the semiconductor substrate no higher than a top surface of the barrier layer.

In other embodiments, forming the recess region is followed by forming a sacrificial layer covering the floating body region, implanting impurity ions of a second conductivity type different from the first conductivity type into the floating body region and removing the sacrificial layer. Forming the sacrificial layer may include forming a silicon oxide layer.

In further embodiments, forming the insulated gate electrode includes forming a gate dielectric layer conformably covering an inner wall of the recess region. A gate conductive layer is formed completely filling the recess region with the gate dielectric layer and covering a surface of the semiconductor substrate. The gate conductive layer is planarized.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the invention.

DETAILED DESCRIPTION OF THE INVENTION

Figure 1:
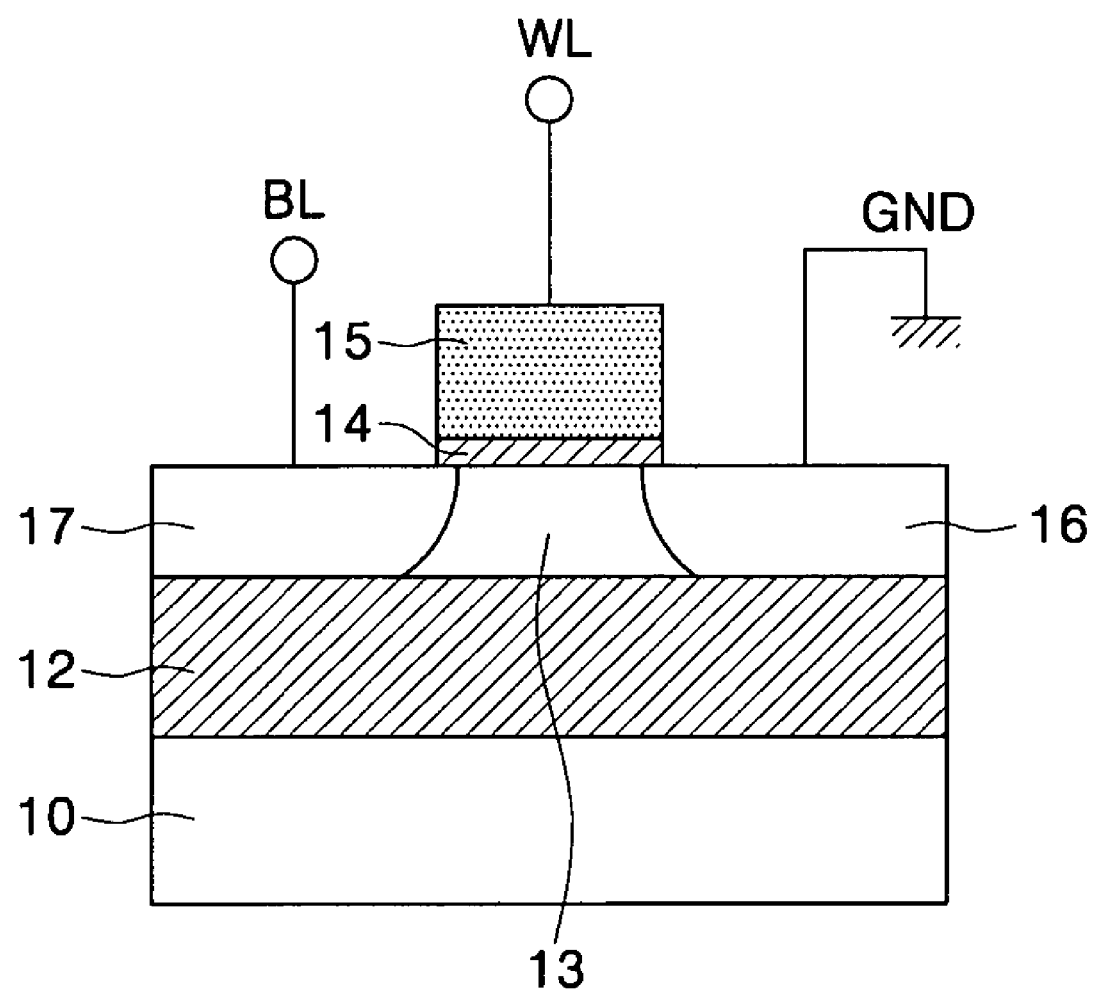
FIG. 1 is a cross-sectional view of a conventional single transistor floating body DRAM cell.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 8:
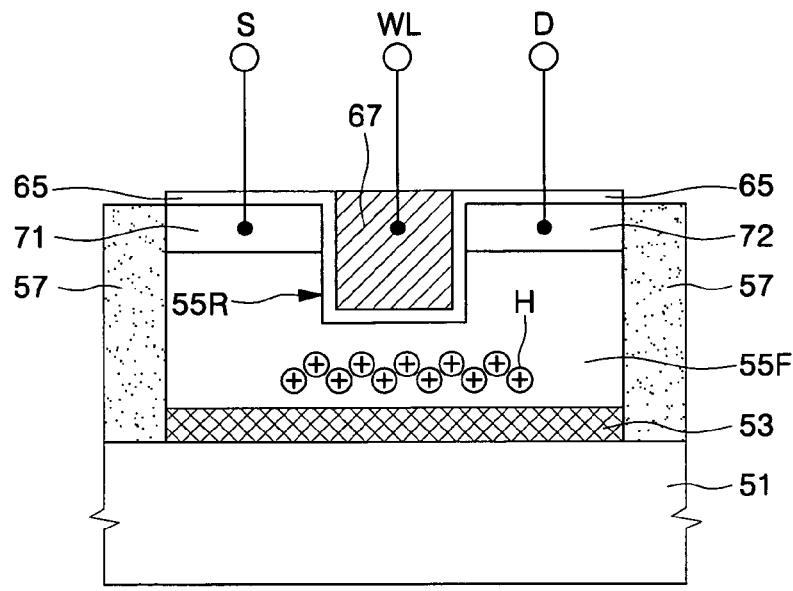
FIGS. 8 and 9 are cross-sectional views illustrating operation methods of a single transistor floating body DRAM cell in accordance with some embodiments of the present invention.
Figure 9:
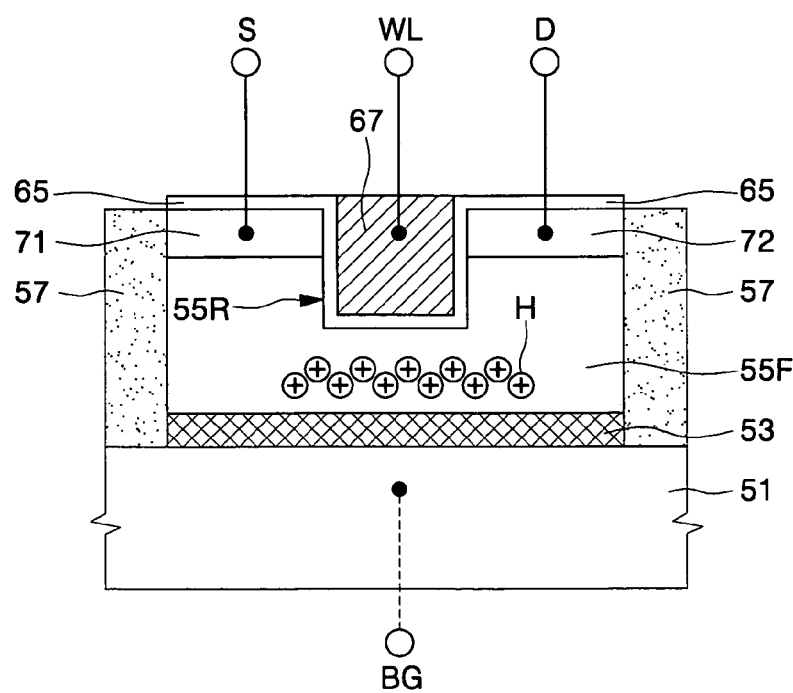

FIGS. 2 to 7 are cross-sectional views illustrating methods of fabricating a single transistor floating body DRAM cell in accordance with some embodiments of the present invention. FIGS. 8 and 9 are cross-sectional views illustrating a single transistor floating body DRAM cell and its operation methods in accordance with some embodiments of the present invention. Referring first to the embodiments of FIG. 8, the single transistor floating body DRAM cell includes a semiconductor substrate 51, and a barrier layer 53 formed on the semiconductor substrate 51. The barrier layer 53 may be a high concentration impurity region of a first conductivity type. The first conductivity type may be an N-type or P-type. For. the purposes of description with reference to the figures, the first conductivity type is an N-type. In some embodiments, the barrier layer 53 may be an oxide layer, such as a buried oxide layer. When the barrier layer 53 is the oxide layer, the semiconductor substrate 51 may be electrically connected to a back gate bias voltage source.

A recess channel transistor is shown formed on the barrier layer 53. The recess channel transistor may include a source region 71, a drain region 72, a floating. body 55F, a gate dielectric layer 65 and a gate electrode 67. The source region 71 and the drain region 72 are spaced apart from each other on the floating body 55F. The floating body 55F is shown formed on the barrier layer 53 and beneath the source region 71 and the drain region 72. The source region 71 and the drain region 72 may be impurity regions of the first conductivity type and the floating body 55F may be an impurity region of a second conductivity type different from the first conductivity type.

As noted above, the first conductivity type may be an N-type or P-type and the second conductivity type is opposite to the first conductivity type. For example, when the first conductivity type is an N-type, the second conductivity type may be a P-type. In contrast, when the first conductivity type is a P-type, the second conductivity type may be an N-type. Hereinafter, it is assumed that the recess channel transistor is an N-type metal oxide semiconductor (NMOS). That is, for purposes of describing the figures, the first conductivity type is an N-type and the second conductivity type is a P-type.

The floating body 55F may have a recess region 55R. The recess region 55R is shown formed between the source region 71 and the drain region 72 and crosses the floating body 55F. A bottom surface of the recess region 55R may be lower than bottom surfaces of the source region 71 and the drain region 72 as illustrated in FIG. 8.

The gate electrode 67 may be formed to fill the recess region 55R. That is, a bottom surface of the gate electrode 67 may be lower than bottom surfaces of the source region 71 and the drain region 72. The gate dielectric layer 65 may be interposed between the gate electrode 67 and the floating body 55F. The gate dielectric layer 65 may extend to cover the source region 71 and the drain region 72. That is, the gate dielectric layer 65 may conformably cover an inner wall of the recess region 55R. The gate electrode 67 may be a conductive material, such as polysilicon. The gate dielectric layer 65 may be a dielectric layer, such as a silicon oxide layer.

An isolation layer 57 may be formed on the semiconductor substrate 51. The isolation layer 57 may be in contact with the barrier layer 53 and the floating body 55F. In addition, a bottom surface of the isolation layer 57 may have the same level (height relative to the substrate 51) as a top surface of the barrier layer 53 or a level lower than the top surface of the barrier layer 53 as shown in FIG. 8. In addition, a top surface of the isolation layer 57 may be higher than a top surface of the floating body 55F. In addition, the top surface of the isolation layer 57 may substantially have the same level as top surfaces of the source region 71 and the drain region 72. The isolation layer 57 may be an insulating layer, such as a silicon oxide layer. Accordingly, the floating body 55F may be electrically isolated by the barrier layer 53, the isolation layer 57, the gate dielectric layer 65, the source region 71 and the drain region 72.

The gate electrode 67 may be connected to a word line WL. The source region 71 may be connected to a source line S. The drain region 72 may be connected to a drain line D. In addition, the drain line D may be electrically connected to a bit line.

As described above, the single transistor floating body DRAM cell according to some embodiments of the present invention includes the recess channel transistor. The recess channel transistor includes the floating body 55F having the recess region 55R. The floating body 55F having the recess region 55R can provide a relatively long effective channel length. That is, the floating body 55F having the recess region 55R has a relatively long effective channel length compared to a conventional planar transistor.

The relatively long effective channel length may be advantageous in limiting or even preventing interruption of operation due to the short channel effect. For example, the short channel effect may include drain-induced barrier lowering (DIBL) and sub-threshold swing. The shorter the effective channel length, the more difficult it generally is to control the drain current by means of the threshold voltage, due to the effect of DIBL. In addition, the shorter the effective channel length, the more difficult it generally is to turn off the transistor, due to the effect of the sub-threshold swing. In contrast, the floating body 55F having the recess region 55R may effectively prevent the operation interruption caused by the DIBL and/or the sub-threshold swing.

The recess channel transistor may be implemented in a relatively small plane compared to the planar transistor. That is, the single transistor floating body DRAM cell having the recess channel transistor structure may be advantageous in terms of high integration compared to the prior art.

Methods of operation of a single transistor floating body DRAM cell according to some embodiments of the present invention will now be described with reference to FIG. 8. Referring to FIG. 8, where the barrier layer 53 is assumed to be an N-type high concentration impurity region, operation of the single transistor floating body DRAM cell will be described. In this case, as described for some embodiments of the present invention, the first conductivity type is an N-type and the second conductivity type is a P-type.

A write operation and an erase operation to the single transistor floating body DRAM cell, i.e., a case of recording the data will be described first. The write operation may record logical data "1". In addition, the erase operation may record logical data "0". The write operation can be carried out using hot-carrier injection (HCI). To detail this type of write operation, the source region 71 is grounded. A word line program voltage higher than a threshold voltage is applied to the gate electrode 67. A bit line program voltage is applied to the drain region 72.

The write operation generates pairs of carriers within the floating body 55F near the drain region 72. The pairs of carriers include electrons and holes. The electrons are passed through the source region 71 and the drain region 72. In contrast, the holes are accumulated within the floating body 55F. The accumulated holes H increase the electric potential of the floating body 55F. The threshold voltage may be reduced by the increase in the electric potential of the floating body 55F.

In some embodiments, the write operation may be performed using band-to-band tunneling. To detail this type of write operation, a negative word line program voltage is applied to the gate electrode 67. A positive program voltage is applied to the source region 71 and the drain region 72. Consequently, pairs of carriers are generated within the floating body 55F near the source region 71 and the drain region 72. The pairs of carriers include electrons and holes. The electrons are passed through the source region 71 and the drain region 72. In contrast, the holes are accumulated within the floating body 55F. The accumulated holes H increase the electric potential of the floating body 55F. The threshold voltage may be reduced by the increase in the electric potential of the floating body 55F.

The erase operation may use tunneling. To detail this type of erase operation, the source region 71 is grounded. A positive word line erase voltage is applied to the gate electrode 67. A negative bit line erase voltage is applied to the drain region 72. The erase operation allows the accumulated holes H to be erased through the drain region 72. The erase operation relatively decreases the electric potential of the floating body 55F. The decrease in the electric potential of the floating body 55F may relatively increase the threshold voltage.

A method of performing a read operation on the single transistor floating body DRAM cell will now be described. The read operation includes grounding the source region 71. A word line read voltage lower than the word line program voltage is applied to the gate electrode 67. A bit line read voltage lower than the bit line program voltage is applied to the drain region 72. The read operation allows drain current to flow through the floating body 55F. The drain current may vary based on the amount of the accumulated holes H present within the floating body 55F. For example, when the accumulated holes H exist within the floating body 55F, a relatively high drain current will flow during the read operation. When the accumulated holes H within the floating body 55F are reduced, a relatively small amount of drain current may flow during the read operation. The drain current can be sensed to read data stored in the single transistor floating body DRAM cell.

FIG. 9 is a cross-sectional view illustrating methods of operating a single transistor floating body DRAM cell in accordance with further embodiments of the present invention. Referring to FIG. 9, when the barrier layer 53 is the oxide layer, such as a buried oxide layer, an operation of the single transistor floating body DRAM cell can be described. As described for purposes of description previously, operations will be described where the first conductivity type is an N-type and the second conductivity type is a P-type. As such, the same operations as those described with reference to FIG. 8 can be employed to perform the write operation, the erase operation, and the read operation on the single transistor floating body DRAM cell of FIG. 9.

In some embodiments, when the barrier layer 53 is an oxide layer, the semiconductor substrate 51 may be electrically connected to the back gate bias voltage source (BG) as shown in FIG. 9. In this case, a negative voltage can be applied to the semiconductor substrate 51 by the back gate bias voltage source BG. In addition, the same operations as those described with reference to FIG. 8 can be employed to carry out the write operation, the erase operation, and the read operation on the single transistor floating body DRAM cell. In this case, the back gate bias voltage source BG can act to relatively increase the retention time of the accumulated holes H.

Figure 2:
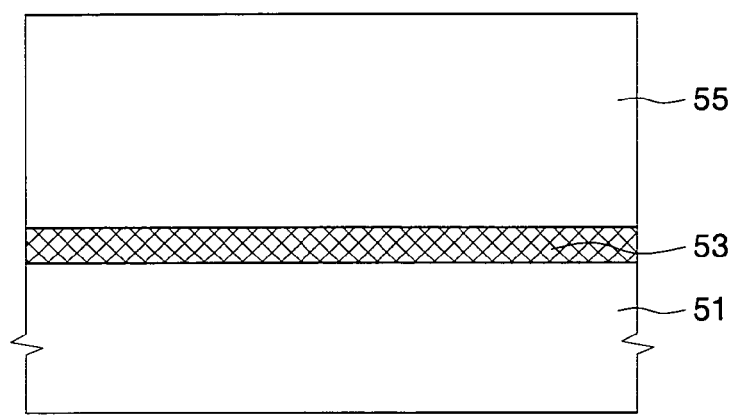
FIGS. 2 to 7 are cross-sectional views illustrating methods of fabricating a single transistor floating body DRAM cell in accordance with some embodiments of the present invention.

Methods of fabricating a single transistor floating body DRAM cell according to some embodiments of the present invention will be described with reference to FIGS. 2 to 7. Referring first to FIG. 2, a barrier layer 53 is formed on a semiconductor substrate 51. The barrier layer 53 may be formed of an oxide layer, such as a buried oxide layer. A body layer 55 is formed on the barrier layer 53. The barrier layer 53 and the body layer 55 may be formed using a technique for forming a silicon-on-insulator (SOI) substrate. For example, the body layer 55 may be formed of single crystalline silicon by an epitaxy method.

In some embodiments, the barrier layer 53 may be formed by implanting impurity ions of a first conductivity type to a predetermined depth of the semiconductor substrate 51. The barrier layer 53 formed of high concentration impurity ions of the first conductivity type may be formed to the predetermined depth of the semiconductor substrate 51. The body layer 55 is formed on the barrier layer 53 while the barrier layer 53 is formed. The semiconductor substrate 51 may be a silicon substrate having a second conductivity type different from the first conductivity type and the body layer 55 may have the second conductivity type. The body layer 55 can be electrically isolated by the barrier layer 53. The first conductivity type may be an N-type or P-type. The second conductivity type is a type different from the first conductivity type. In some embodiments and as described for purposes of illustration herein, the first conductivity type is an N-type and the second conductivity type is a P-type. That is, the body layer 55 may have P-type impurity ions.

Figure 3:
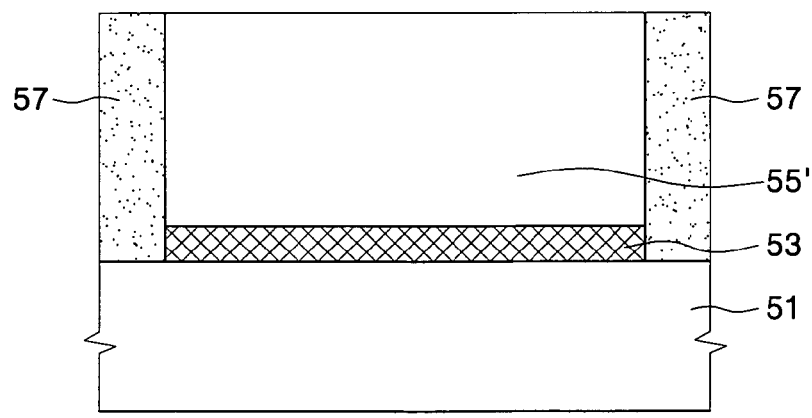

Referring to FIG. 3, an isolation layer 57 may be formed within the body layer 55. More particularly, a trench mask pattern (not shown) may be formed on the semiconductor substrate 51 having the body layer 55. The body layer 55 and the barrier layer 53 may be selectively etched using the trench mask pattern as an etch mask to form an isolation trench defining a floating body region 55'. The isolation trench can completely penetrate the body layer 55 to expose the barrier layer 53. In addition, the isolation trench can penetrate the body layer 55 and the barrier layer 53 to expose the semiconductor substrate 51. The isolation layer 57 can fill the isolation trench. Subsequently, the trench mask pattern is removed to expose a top surface of the floating body region 55'. The isolation layer 57 may be formed of an insulating layer, such as a high-density plasma oxide layer and/or a silicon oxide layer by means, for example, of a chemical vapor deposition (CVD) method.

In the illustrated embodiments, a bottom surface of the isolation layer 57 completely penetrates the floating body region 55' to be lower (relative to the substrate 51) than a top surface of the barrier layer 53. For example, the bottom surface of the isolation layer 57 may completely penetrate the floating body region 55' to be in contact with the top surface of the barrier layer 53. In addition, the bottom surface of the isolation layer 57 may penetrate the floating body region 55' and the barrier layer 53 to be in contact with a top surface of the semiconductor substrate 51. A top surface of the isolation layer 57 may be formed at the substantially same level as the top surface of the floating body region 55'. As such, the floating body region 55' can be electrically isolated by the barrier layer 53 and the isolation layer 57.

Figure 4:
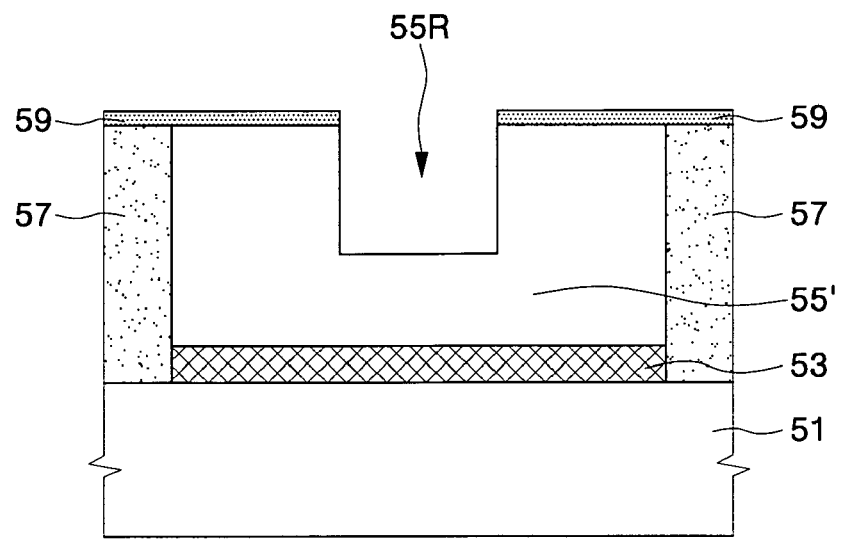

Referring now to FIG. 4, a recess mask pattern 59 may be formed on the semiconductor substrate 51 having the isolation layer 57. The recess mask pattern 59 may be formed of a material layer having an etch selectivity with respect to the floating body region 55'. For example, the recess mask pattern 59 may be formed of a nitride layer, such as a silicon nitride layer by means, for example, of a CVD method. The floating body region 55' is partially removed using the recess mask pattern 59 as an etch mask to form a recess region 55R. The recess region 55R may be formed to cross the floating body region 55'. Subsequently, the recess mask pattern 59 is removed to expose the floating body region 55'.

Figure 5:
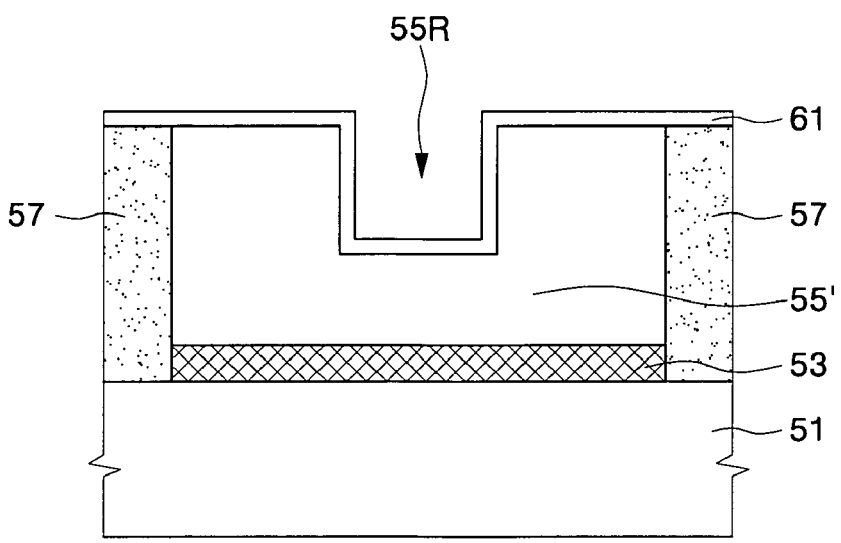

Referring to FIG. 5, a sacrificial layer 61 may be formed on the semiconductor substrate 51 having the recess region 55R. The sacrificial layer 61 may be formed to conformably cover an inner wall of the recess region 55R and a top surface of the floating body region 55'. The sacrificial layer 61 may be formed of an oxide layer, such as a silicon oxide layer. Subsequently, channel ions may be implanted into the floating body region 55'. The channel ions may be impurity ions of the second conductivity type. The process of implanting the channel ions may use various ion implantation energies and/or ion implantation angles. The sacrificial layer 61 can act to limit or prevent the floating body region 55' from being damaged while the channel ions are implanted. Subsequently, the sacrificial layer 61 is removed to expose the floating body region 55'.

Figure 6:
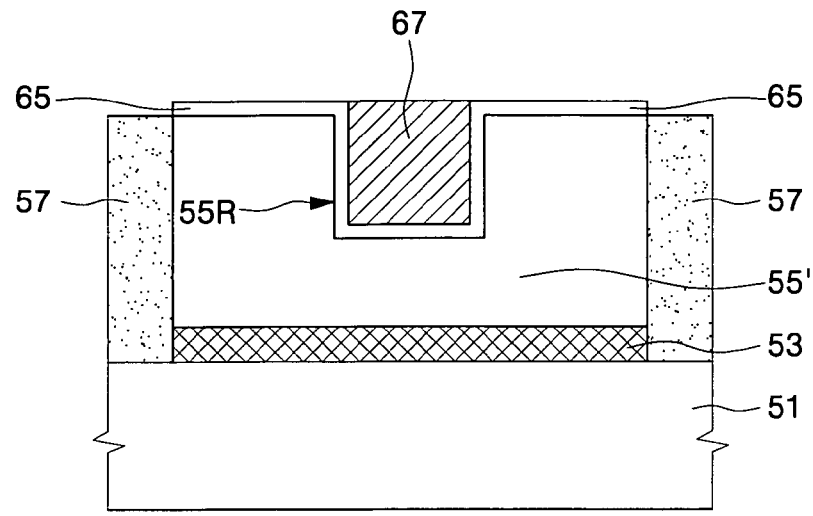

Referring to FIG. 6, a gate dielectric layer 65 may be formed on the floating body region 55'. The gate dielectric layer 65 may be formed to conformably cover an inner wall of the recess region 55R. The gate dielectric layer 65 may be formed of a dielectric layer selected from the group consisting of a silicon oxide layer, a metal oxide layer, a silicon nitride layer, and a silicon oxynitride layer. In some embodiments, the gate dielectric layer 65 comprises a silicon oxide layer, a metal oxide layer, a silicon nitride layer and/or a silicon oxynitride layer. In addition, the gate dielectric layer 65 may be formed of multi layers of at least two layers selected from the group of materials previously described. For example, the gate dielectric layer 65 may be formed of a silicon oxide layer by a thermal oxidation method. In this case, the gate dielectric layer 65 may be formed only on an exposed surface of the floating body region 55'. On the isolation layer 57, formation of the silicon oxide layer by the thermal oxidation method may be suppressed. In some embodiments, the gate dielectric layer 65 may be formed of a silicon oxide layer by a CVD method. In this case, the gate dielectric layer 65 may be formed on the entire surface of the semiconductor substrate 51. In some embodiments, the gate dielectric layer 65 may be formed by an atomic layer deposition method.

A gate electrode 67 may be formed to fill the recess region 55R. More particularly, a gate conductive layer may be formed on the semiconductor substrate 51 having the gate dielectric layer 65. The gate conductive layer may fill the recess region 55R and cover the entire surface of the semiconductor substrate 51. The gate conductive layer may be formed of a conductive material, such as polysilicon or metal. The gate conductive layer may be planarized to form the gate electrode 67. The process of planarizing the gate conductive layer may employ a chemical mechanical polishing (CMP) process and/or an etchback process.

Figure 7:
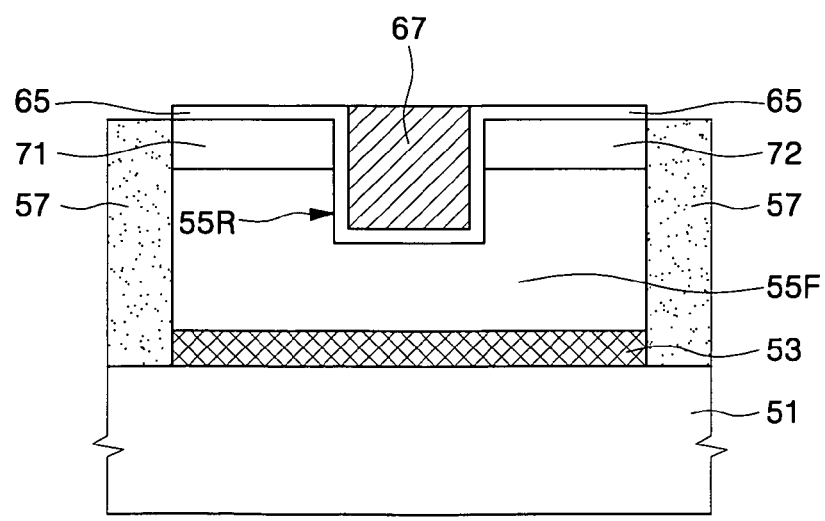

Referring to the embodiments of FIG. 7, impurity ions of the first conductivity type are implanted into the floating body region 55' using the gate electrode 67 and the isolation layer 57 as ion implantation masks to form a source region 71 and a drain region 72. As a result, the floating body 55F is defined beneath the source region 71 and the drain region 72. In some embodiments, bottom surfaces of the source region 71 and the drain region 72 are higher than a bottom surface of the gate electrode 67. That is, a bottom surface of the recess region 55R may be lower than the bottom surfaces of the source region 71 and the drain region 72. As a result, the floating body 55F may have a relatively long effective channel length due to the recess region 55R. The deeper the recess region 55R becomes, the longer the effective channel length may become.

Semiconductor processes, such as formation of an inter-insulating layer and a word line, may be carried out on the semiconductor substrate 51 having the gate electrode 67, the source region 71, and the drain region 72 so that the single transistor floating body DRAM cell can be fabricated. In addition, when the barrier layer 53 is formed of the oxide layer, the semiconductor substrate 51 may be electrically connected to a back gate bias voltage source.

It will be understood that, in further embodiments of the present invention, a PMOS type recess channel transistor may be provided using operations substantially similar to those described above with reference to the first conductivity type being N-type.

According to some embodiments of the present invention as described above, a single transistor floating body DRAM cell having a recess channel transistor is provided. The recess channel transistor includes a floating body having a recess region. The floating body having the recess region has a relatively long effective channel length compared to the conventional planar transistor. Accordingly, the recess channel transistor may have a structure advantageous to high integration compared to the planar transistor, which may be beneficially utilized in forming a single transistor floating body DRAM cell providing for high integration.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of fabricating a single transistor floating body dynamic random access memory (DRAM) cell, comprising:
   forming a barrier layer on a semiconductor substrate;
   forming a body layer on the barrier layer;
   forming an isolation layer defining a floating body region within the body layer, the isolation layer being in contact with the barrier layer and the floating body region and having a bottom surface positioned at a level relative to the semiconductor substrate no higher than a top surface of the barrier layer;
   forming a recess region in the floating body region;
   forming a gate electrode in the recess region; and
   implanting impurity ions of a first conductivity type into a portion of the floating body region on a first side of the recess region to define a source region and into a portion of the floating body on an opposite side of the recess region to define a drain region to provide a floating body.

2. The method of claim 1, wherein bottom surfaces of the source and drain regions are at a level higher relative to the substrate than a bottom surface of the gate electrode and wherein the gate electrode comprises an insulated gate electrode and wherein forming the barrier layer comprises forming the barrier layer by implanting impurity ions of the first conductivity type into the semiconductor substrate.

3. The method of claim 1, wherein forming the barrier layer comprises forming an oxide layer.

4. The method of claim 1, wherein forming the insulated gate
   forming a gate dielectric layer conformably covering an inner wall of the recess region;
   forming a gate conductive layer completely filling the recess region with the gate dielectric layer and covering a surface of the semiconductor substrate; and
   planarizing the gate conductive layer.

5. A method of fabricating a single transistor floating body dynamic random access memory (DRAM) cell, comprising:
   forming a barrier layer on a semiconductor substrate;
   forming a body layer on the barrier layer;
   forming an isolation layer defining a floating body region within the body layer;
   forming a recess region in the floating body region;
   forming a gate electrode in the recess region; and
   implanting impurity ions of a first conductivity type into a portion of the floating body region on a first side of the recess region to define a source region and into a portion of the floating body on an opposite side of the recess region to define a drain region to provide a floating body,
   wherein forming the recess region is followed by:
   forming a sacrificial layer covering the floating body region;
   implanting impurity ions of a second conductivity type different from the first conductivity type into the floating body region; and
   removing the sacrificial layer.

6. The method of claim 5, wherein forming the isolation layer comprises forming the isolation layer in contact with the barrier layer and the floating body region and having a bottom surface positioned at a level relative to the semiconductor substrate no higher than a top surface of the barrier layer.

7. The method of claim 5, wherein forming the sacrificial layer comprises forming a silicon oxide layer.

8. A method of fabricating a single transistor floating body dynamic random access memory (DRAM) cell, comprising:
   forming a barrier layer on a semiconductor substrate;
   forming a body layer on the barrier layer;
   forming an isolation layer defining a floating body region within the body layer;
   forming a recess region in the floating body region;

forming a gate electrode in the recess region; and implanting impurity ions of a first conductivity type into a portion of the floating body region on a first side of the recess region to define a source region and into a portion of the floating body on an opposite side of the recess region to define a drain region to provide a floating body, wherein the floating body includes a hole accumulation region.

9. The method of claim 8, wherein bottom surfaces of the source and drain regions are at a level higher relative to the substrate than a bottom surface of the gate electrode and wherein the gate electrode comprises an insulated gate electrode and wherein forming the barrier layer comprises forming the barrier layer by implanting impurity ions of the first conductivity type into the semiconductor substrate.

10. The method of claim 8, wherein forming the barrier layer comprises forming an oxide layer.

11. The method of claim 8, wherein forming the isolation layer comprises forming the isolation layer in contact with the barrier layer and the floating body region and having a bottom surface positioned at a level relative to the semiconductor substrate no higher than a top surface of the barrier layer.

12. The method of claim 8, wherein forming the recess region is followed by:

forming a sacrificial layer covering the floating body region;

implanting impurity ions of a second conductivity type different from the first conductivity type into the floating body region; and removing the sacrificial layer.

13. The method of claim 12, wherein forming the sacrificial layer comprises forming a silicon oxide layer.

14. The method of claim 8, wherein forming the insulated gate electrode includes:

forming a gate dielectric layer conformably covering an inner wall of the recess region;

forming a gate conductive layer completely filling the recess region with the gate dielectric layer and covering a surface of the semiconductor substrate; and planarizing the gate conductive layer.

* * * * *

UNITED STATES PATENT AND TRADEMARK OFFICE
CERTIFICATE OF CORRECTION

PATENT NO. : 7,338,862 B2  Page 1 of 1
APPLICATION NO. : 11/335333
DATED : March 4, 2008
INVENTOR(S) : Huo et al.

It is certified that error appears in the above-identified patent and that said Letters Patent is hereby corrected as shown below:

Column 12, Claim 4, Line 25: "gate" should read -- gate electrode includes: --

Signed and Sealed this

Seventeenth Day of June, 2008

JON W. DUDAS
*Director of the United States Patent and Trademark Office*